(12) United States Patent
Shetty et al.

(10) Patent No.: US 9,797,948 B2
(45) Date of Patent: *Oct. 24, 2017

(54) SCAN-BASED MCM INTERCONNECT TESTING

(71) Applicant: TEXAS INSTRUMENTS INCORPORATED, Dallas, TX (US)

(72) Inventors: Milan Shetty, Bangalore (IN); Srinivasulu Alampally, Bangalore (IN); Prasanth V, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/830,899

(22) Filed: Aug. 20, 2015

(65) Prior Publication Data

US 2015/0355278 A1    Dec. 10, 2015

Related U.S. Application Data

(63) Continuation of application No. 13/407,369, filed on Feb. 28, 2012, now Pat. No. 9,140,754.

(30) Foreign Application Priority Data

Feb. 28, 2011 (IN) .............................. 596/CHE/2011

(51) Int. Cl.
  *G01R 31/28*   (2006.01)
  *G01R 31/3177*   (2006.01)
  (Continued)

(52) U.S. Cl.
  CPC ... *G01R 31/3177* (2013.01); *G01R 31/31727* (2013.01); *G01R 31/31855* (2013.01)

(58) Field of Classification Search
  CPC .......... G01R 31/3177; G01R 31/31727; G01R 31/31855
  See application file for complete search history.

(56) References Cited

U.S. PATENT DOCUMENTS 6,000,051 A * 12/1999 Nadeau-Dostie ... G01R 31/31855
                                                      327/144
6,327,684 B1   12/2001 Nadeau-Dostie et al.
(Continued)

OTHER PUBLICATIONS

M. H. Tehranipour et al., "Multiple Transition Model and Enhanced Boundary Scan Architecture to Test Interconnects for Signal Integrity", IEEE Proceedings of the 21st ICCD, 2003.

*Primary Examiner* — Thien D Nguyen
(74) *Attorney, Agent, or Firm* — Tuenlap D. Chan; Charles A. Brill; Frank D. Cimino

(57) ABSTRACT

A multi-die chip module (MCM) comprises a first die containing a first test controller and a second die containing a second test controller coupled to the first die via an interconnect. The first test controller is configured to place the first die in either a shift mode or a capture mode. The second controller is configured to place the second die in either the shift mode or the capture mode. After a scan shift operation, scan cells are initialized to predetermined values. During the capture operation one die remains in the shift mode and the other die enters the capture mode so that as test bits are shifted into registers associated with output pads on the die in the shift mode, the other die is in the capture mode and captures signals on input pads associated with that die, enabling scan based at-speed testing of the interconnect.

18 Claims, 3 Drawing Sheets

(51) Int. Cl.
*G01R 31/317* (2006.01)
*G01R 31/3185* (2006.01)

(56) References Cited

U.S. PATENT DOCUMENTS

| | | | |
|---|---|---|---|
| 6,510,534 | B1 | 1/2003 | Nadeau-Dostie et al. |
| 6,640,324 | B1 * | 10/2003 | Goldovsky .... G01R 31/318538 714/726 |
| 7,818,640 | B1 * | 10/2010 | Lerner ........... G01R 31/318555 714/726 |
| 2002/0078420 | A1 * | 6/2002 | Roth ............... G01R 31/318572 714/798 |
| 2010/0096629 | A1 * | 4/2010 | Chen ...................... G11C 29/32 257/48 |
| 2012/0047413 | A1 * | 2/2012 | Chung ........... G01R 31/318555 714/731 |
| 2012/0126846 | A1 * | 5/2012 | Jong .............. G01R 31/318555 324/762.03 |
| 2012/0167100 | A1 * | 6/2012 | Li ........................... G11C 16/26 718/102 |
| 2012/0221906 | A1 | 8/2012 | Shetty et al. |

* cited by examiner

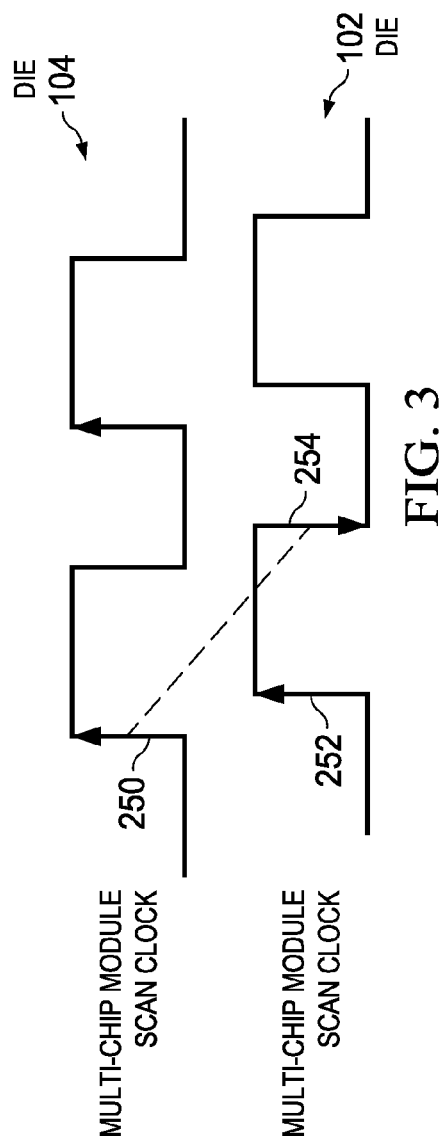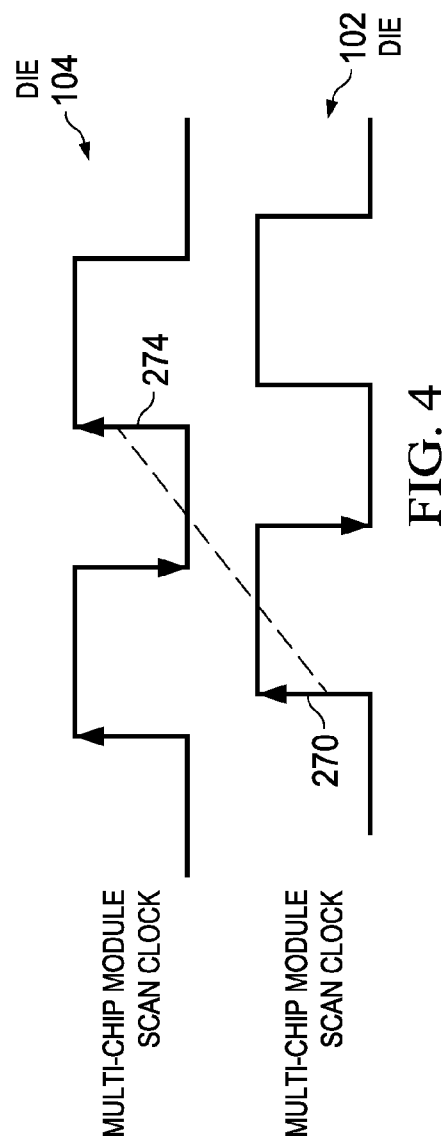

SCAN-BASED MCM INTERCONNECT TESTING

CROSS-REFERENCE TO RELATED APPLICATION

Under 35 U.S.C. §120, this continuation application claims priority to and benefits of U.S. patent application Ser. No. 13/407,369, filed on Feb. 28, 2012, which also claims priority to Indian Patent Application No. 596/CHE/2011, filed on Feb. 28, 2011. The entirety of both parent applications is incorporated herein by reference.

BACKGROUND

Typically, chip level input/output (IO) interfaces are tested and characterized separately against interface requirements. When two chips are connected on a PCB, minimal system level testing is done using Boundary Scan testing which targets "stuck-at" faults (e.g., short circuits, open circuits). This typically meets the requirements as these interfaces are already characterized completely.

In a multichip module (MCM), multiple semiconductor dies are packaged onto a unifying substrate. The two dies have an interface between them. In MCM devices, the individual die I/Os are not characterized separately unlike chip-level I/Os. Creating test cases manually, for testing and charactering MCM interfaces can be tedious and error-prone and may even prove impossible, as tests targeting multiple fault types is taken into account. If these MCM IOs and interconnects are not tested and characterized completely, it can potentially cause functional failures. Hence simple boundary scan testing, which targets stuck-at faults, may not be sufficient for testing MCM interconnects.

Traditionally, MCM interconnects are tested using boundary scan testing. The two dies in an MCM have separate boundary scan test access ports associated with them. Such boundary scan testing methodology comes with all the inherent limitations of the boundary scan testing. For example, boundary scan was originally designed to test the board interconnects where the individual dies are tested and characterized and only stuck-testing is required to test the interface integrity. The interval between the update of test stimulus and capture of the response spans at least 2.5 test clock cycles. This delay makes boundary scan testing insufficient for screening of various problems such as delay defects, cross-talk, simultaneous switching noise etc. In-addition test vector generation requires boundary scan software/custom scripts.

Some at-speed testing strategies pursued for MCM testing includes functional testing, MCM built-in self test (BIST) and oscillation-based methodologies. In functional testing, test-cases are coded to target the MCM interconnect defects. In the BIST methodology, a pseudo-random pattern generator is used to generate random values on one die, and these values are captured on the other die. The values are later checked to verify the integrity of the interconnects. In the oscillation-based methodology, the traditional boundary scan cells are modified and are arranged to form a ring for creating oscillations by having odd number of cells in the ring. In these testing methodologies, targeting the faults leading to reliability issues is quite difficult. Also there is no straightforward method to isolate the failures in post silicon debug. In-addition, the MCM BIST and oscillation based test methodologies involves additional hardware and the targeted tests for traditional fault models are not possible. Also, none of the existing methods take into account clocking and process variations between the dies.

SUMMARY

The disclosed embodiments address the above issues. For example, one embodiment is directed to a multi-die chip module (MCM) that comprises a first die containing a first test controller and a second die containing a second test controller and coupled to the first die via an interconnect. The interconnect comprises multiple signal lines. The first test controller is configured to place the first die to be in one of a shift mode and a capture mode while the second controller is configured to place the second die in the other of the shift mode and capture mode. After a scan shift operation, all the scan cells are initialized to a predetermined value and during the capture operation one die remains in the shift mode and the other die enters the capture mode so that as test bits are shifted into registers associated with output pads on the die in the shift mode, the other die is in the capture mode and captures signals on input pads associated with that die, enabling scan based at-speed testing of the interconnect.

Another embodiment is directed to a multi-die chip module (MCM) that comprises a first die containing a first test controller and a plurality of input/output (I/O) pads and a second die containing a second test controller and a plurality of I/O pads. The I/O pads of the second die are electrically connected via an electrical interconnect to the I/O pads of the first die. A plurality of scan cells is also provided; one scan cell corresponding to an I/O pad of each of the first die and the second die. The scan cells are connected in a scan chain. The first test controller is configured to place the first die to be in one of a shift mode and a capture mode while the second controller is configured to place the second die in the other of the shift mode and capture mode, so that as test bits are shifted into scan cells associated with output pads on the die in the shift mode, the other die is in the capture mode and its scan cells captures signal received across the electrical interconnect, without the die in the shift mode performing an update operation to latch in the test bits before their capture by the second die.

BRIEF DESCRIPTION OF THE DRAWINGS

For a detailed description of exemplary embodiments of the disclosure, reference will now be made to the accompanying drawings in which:

FIG. 3 illustrates a timing diagram for launching data from one die and capturing the data on the other die in accordance with various embodiments; and FIG. 4 illustrates a timing diagram for launching data in the opposite direction as FIG. 3.

DETAILED DESCRIPTION

The following discussion is directed to various embodiments of the disclosure. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1:
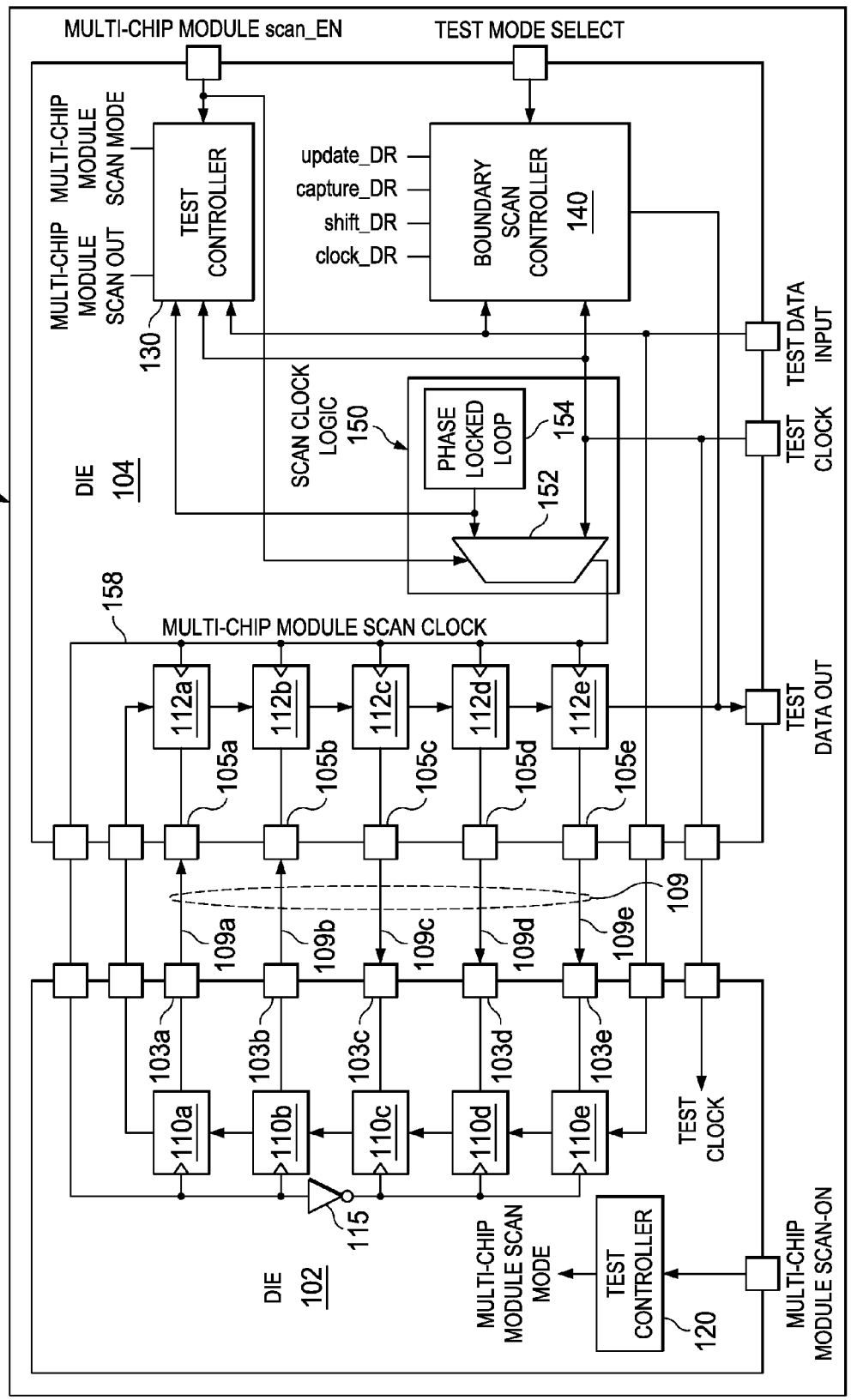
FIG. 1 shows a multi-chip module (MCM) is shown in accordance with various embodiments.

FIG. 1 illustrates an example of a multi-chip module (MCM). The MCM 100 of FIG. 1 comprises two dies 102 and 104 packaged onto a unifying substrate 106. More than two dies may be included on substrate 106 in other embodiments. In some implementations, the dies 102, 104 may be of different process technology and different process corners. For example, one die may be from a 90 nm process technology, strong corner, while the other die is from a 65 nm process technology, weak process corner. In other embodiments, both dies may be from the same process technology.

Die 102 includes multiple pads 103 that provide connection points for the die. Some pads 103 may be used to connect die 102 to corresponding pads 105 of die 104 as shown. Through various pads, dies 102 and 104 are connected together in an MCM interface 109. Each pad 103, 105 functions as an output pad or an input pad. In the example of FIG. 1, pads 105a and 105b on die 104 represent output pads through which data is transmitted across MCM interconnect 109 to input pads 103a and 103b, respectively, on die 102. Similarly, pads 103c-103e function as output pads through which data is transmitted to input pads 105c-105e, respectively, on die 104.

Die 102 includes a scan cell 110 associated with each pad 103. Five scan cells 110a, 110b, 110c, 110d, and 110e are illustrated for each of five pads 103. Die 104 also includes a scan cell 112 associated with each of its pads 105. Die 104 includes scan cells 112a, 112b, 112c, 112d, and 112e.

Figure 2:
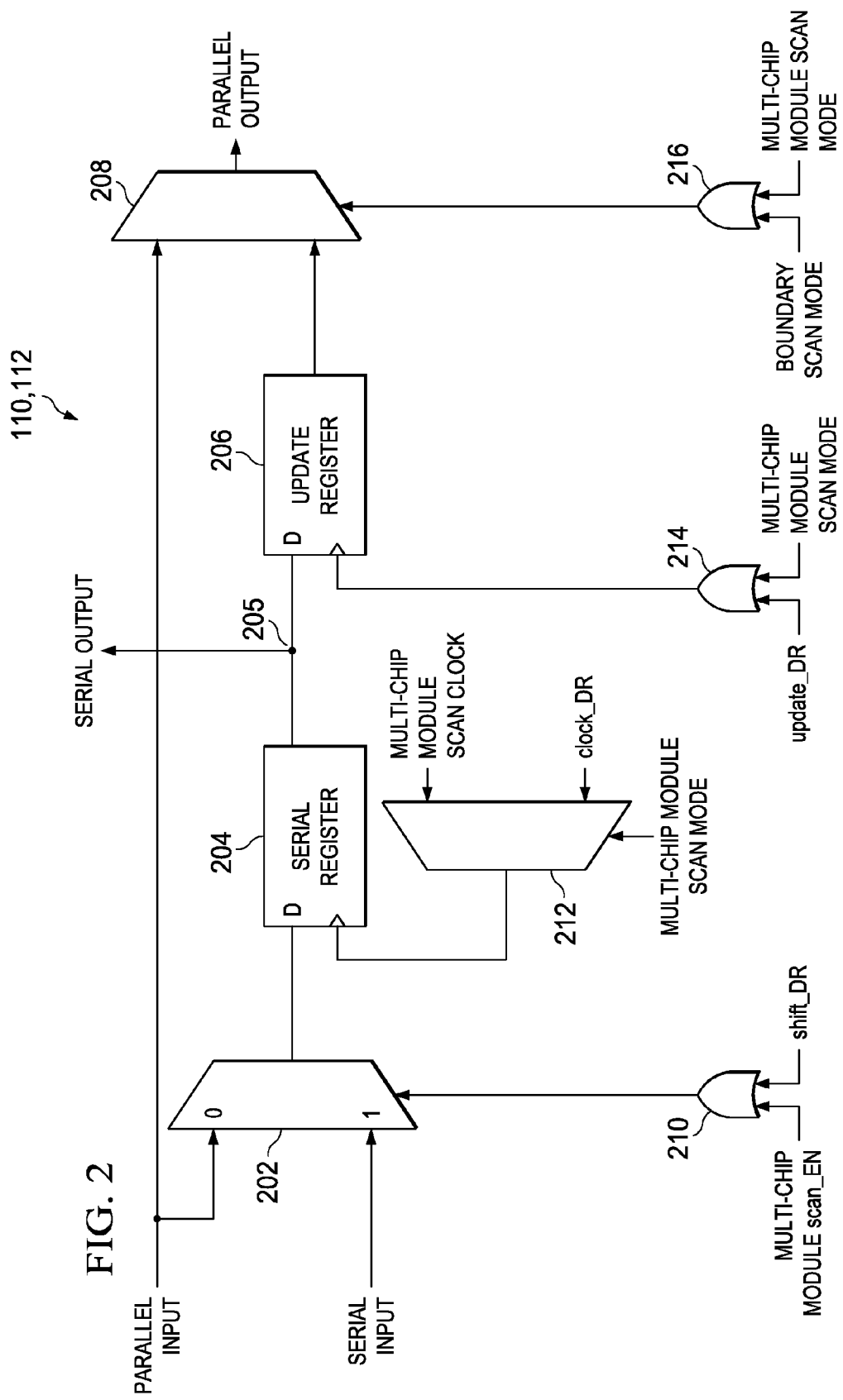
FIG. 2 illustrates an example boundary scan cell for use in testing the MCM interconnect of FIG. 1.

Each scan cell 110, 112 can be implemented in a variety of different forms including, for example, a modified boundary scan cell architecture as depicted in FIG. 2 and discussed below. Other implementations are possible as well. As shown, the scan cells 110 are serially connected together to form a boundary scan chain. Each scan cell 110, 112 can function in one of several modes. In a scan shift mode, a scan cell can serially shift bits around the boundary scan chain. Die 104 includes a Test Data Input (TDI) which is provided to scan cell 110e as shown. A bit shifted into scan cell 110e can then be shifted serially to scan cell 110d, and from scan cell 110d to scan cell 110c, and so on. From scan cell 110a, the bit is shifted across the inter-die interface to scan cell 112a of die 104. The bit can continue to be shifted through scan cell 112b, then 112c, 112d, and then to 112e.

Each scan cell 110, 112 is also capable of operating in a launch mode. In this mode, signal values present on scan cell outputs are passed out through the die's pads 103, 105 and to the other die's corresponding pads. Each die is also capable of a capture mode in which signal values on a die's input pads 103, 105 are loaded into the die's scan cell 110, 112, Die 104 includes a pair of controllers, although a different number of controllers may be included as well. One controller is a test controller 130 and another controller is a boundary scan controller 140. Each controller 130 and 140 receives various input signals as shown and generated output signals that are provided to the scan cells 112a-112e of die 104. The boundary scan controller 140 may be a standard JTAG (Joint Test Action Group) controller and is capable of implementing standard boundary scan testing using the various scan cells 110, 112. The input and output signals used for JTAG boundary scan testing include the TDI signal, a Test Data Out (TDO) signal, a Test Clock (TCK) and a Test Mode Select (TMS) signal, all of which are shown in FIG. 1 as inputs/outputs to die 104. The TDI signal is routed across the inter-die interface to scan cell 110e of die 102 as noted above. The serial output of scan cell 112e on die 104 represents the TDO signal. The TCK signal is used by logic on die 104 as well as on die 102.

Test controller 130 also uses the scan cells 110, 112, but does so in a different manner than the boundary scan controller 140 and performs "at speed" testing of the MCM interface 109. "At speed" testing refers to how accurately a responds to stimuli at or near rated system speeds. At speed testing is in contrast to standard boundary scan testing which tests for static faults such as short circuits and open circuits. At speed testing may include determining an output of a circuit within a clock cycle time period of the input stimuli.

Die 104 also includes scan clock logic 150. Scan clock logic 150 includes multiplexer logic 152 and a phase locked loop (PLL) 154. Under control of an MCM scan_en input signal to die 104, the multiplexer logic 152 selects either the TCK or a clock signal form the PLL 154 as an output clock signal called MCM scan clock 158. The frequency of TCK preferably is lower than the frequency of the PLL's clock signal. In one example, TCK has a frequency of 10 MHz, while the clock from PLL 154 has a frequency of 37.5 MHz. Accordingly, the MCM scan clock has one frequency at some points in time and another frequency at other points in time. When a scan cell is operating in a shift mode during MCM testing, bits through the scan cell are shifted in accordance with a lower frequency clock. When a scan cell is operating in launch or capture modes, the scan cell operates in accordance with a higher frequency clock. The scan cell clock 150 provides both clock frequencies, albeit not at the same time, in accordance with the MCM scan-en signal of die 104. An inverter 115 is used to invert the MCM scan clock for scan cells 110c-110e in which data flows from die 104 to die 102 which is an opposite direction from the flow of data for scan cells 110a and 110b (data flows from die 102 to die 104). The inversion of the clock provided to the scan cells associated with input pads, 110c to 110e helps to test the MCM interconnects 109c to 109e at-speed.

Die 102 includes a test controller 120. Each die 102, 104 has its own separate MCM scan-en signal provided to each of the respective test controller 120 and 130. Each MCM scan-en signal is able to cause the respective die to be in a shift mode independent of the other die. The test controller 120 of die 102 receives the MCM scan-en signal input to die 102 and generates an MCM scan mode signal which is provided to each of the scan cells 110a-110e of die 102. The MCM scan mode signal which dictates whether the scan cells 110a-110e of die 102 are in a shift mode or a capture mode. Test controller 130 of die 104 also generates an MCM scan mode signal based on the MCM scan-en signal of die 104. The MCM scan mode signal generated by the test controller 130 of die 104 is provided to each of the scan cells 112a-112e of die 104 to dictate whether the scan cells are in a shift mode or a capture mode. Because each die has its own MCM scan-en signal, one die can be in a shift mode, while another die is in the capture mode. The ability to have both dies to be in different modes enables at speed testing to occur. Bits are serially shifted in through TDI to the various desired scan cells 110, 112 in accordance with the lower speed TCK and capture occurs on the next active edge of the MCM scan clock, without the aforementioned delay (2.5 clock cycles) in accordance with the higher speed clock from the PLL 154.

FIG. 2 illustrates an embodiment of a scan cell 110, 112. The scan cell in FIG. 2 comprises an input multiplexer 202, a serial register 204, an update register 206, and an output demultiplexer 208. Three OR gates 210, 214 and 216 are also included to provide the various control signals to control the input multiplexer 202, serial register 204, update register 206, and output demultiplexer 208. A multiplexer 212 is also provided as shown. During a "normal" mode (i.e., not a test mode), the parallel input data is provided straight through as the output of the demultiplexer 208.

The scan cell 110, 112 can be operated as a standard boundary scan cell for detecting, for example, stuck-at faults, and alternatively as a test cell to test the MCM interconnect 109 at speed. The use of the boundary scan cells for performing stuck-at testing is well known and will not be repeated here. A separate set of control signals is used for each testing paradigm. For standard boundary scan testing (e.g., stuck at testing), the control signals used are the shift_DR, clock_DR, update_DR, and B/S mode signals. For MCM interconnect at-speed testing, the control signals are the MCM scan-en, MCM scan mode, and MCM scan clock signals. When performing at-speed MCM interconnect testing, the shift_DR, clock_DR, update_DR, and B/S mode signals used during standard boundary scan testing are forced to a state that does not interfere with the MCM interconnect testing. For example, the shift_DR, update_DR, and B/S mode signals are forced low. The selection of which set of control signals is to be used to control the registers 204 and 206, multiplexer 202 and demultiplexer 208 is made by the OR gates 210, 214, 216 and multiplexer 212.

Referring to FIGS. 1 and 2, for MCM interconnect testing at speed, data is shifted in from TDI through the various scan cells 110, 112 until the bits are resident at the desired scan cell locations. When a scan cell is operated in a shift mode (as dictated by the MCM scan-en signal), the bit on the serial input is provide through to multiplexer 202 to serial register 204. Serial register 204 is clocked by the MCM scan clock to latch the serial input bit node 205 (between serial register 204 and update register 206). The signal on node 205 represents the serial output bit of the scan cell and is connected to the next scan cell in the boundary scan chain. The update register 206 used for the boundary scan update process is made transparent during the MCM at-speed testing. As such, as serial inputs are shifted through the scan cell, each such bit is immediately provided through the update register and demultiplexer 208 as the parallel output bit across the MCM interconnects to the other die.

Once the test bits have been shifted into the correct locations, the MCM scan-en signal of the corresponding/receiving die is forced low to enable capture. Capture occurs synchronized with a particular edge of the MCM scan clock as explained below. The captured bits then can be shifted around the boundary scan chain and out through TDO.

Clocking is a challenge during MCM interconnect testing because the two dies 102 and 104 may be from different process nodes. Further, the two dies may be from two different process corners such as strong die 102-weak die 104 or weak die 102-strong die 104. Accordingly, clock insertion delays and clock skew can vary dramatically among the dies. In accordance with the preferred embodiments, a clocking scheme is employed to address clock uncertainty in testing of the MCM interconnect 109. Preferably, a single clock is used for the scan cells in the dies 102, 104. The clock may be generated in one of the dies and provided to the other die. In the example of FIG. 1, the clock is generated in die 104 (MCM scan clock 158) and provided to die 102. The MCM scan clock on die 102 is a delayed version of the MCM scan clock on die 104 due to a higher die interconnect delay of the MCM.

The use of the MCM scan clock 158 to perform the capture operation depends on the direction the test data is being transmitted. One clocking scheme is used when die 102 updates and die 104 captures the data, and another clocking scheme is used in the opposite direction, that is, when die 104 updates and die 102 captures the data.

Consider first the scenario when die 104 updates and die 102 captures test data. This scenario applies to the testing of interconnect lines 109c-109e in FIG. 1. These lines are used to transmit data from die 104 to die 102. To test this portion of the MCM interconnect 109, test bits are shifted around the scan chain until the test bits are at scan cells 112c-112e. The bits are loaded into the relevant scan cells (scan cells 112c-112e) and are directly captured by scan cells 110c-110e on the next active edge of the MCM scan clock. For testing interconnect lines 109c-109e, die 104 is kept in the shift mode by asserting the MCM scan-en signal for die 104 to a logic high level and maintaining its MCM scan-en signal high for initialization and launching the test bits, while die 102 is maintained in the capture mode by forcing its MCM scan-en signal low to capture the parallel input bit into its serial register 204 upon a particular edge of the MCM scan clock on die 102.

FIG. 3 illustrates the applicable timing diagram for launching on die 104 and capturing on die 102. The clock signal shown is that of the MCM scan clock. The upper MCM scan clock signal in FIG. 3 is the MCM scan clock on die 104 while the lower MCM scan clock signal is the clock on die 102 and is a delayed version of the MCM scan clock as noted above. When launching a test bit from die 104 and capturing on die 102, data is launched on a rising or falling edge 250 of the MCM scan clock 158 on die 104 and captured on an opposite edge of the MCM scan clock on die 102. The edge 250 that launches the bit clocks the serial register 204 in the scan cell of die 104. Update register 206 is a transparent latch as noted above which permits the bit to be provided through demultiplexer 208 and across the MCM interconnect. The edge 254 of the MCM scan clock on the receiving die 102 clocks the serial register 204 of the receiving scan cell to latch in the captured bit. In the example of FIG. 3, data is launched on a rising edge of the MCM scan clock on die 104 and captured on a subsequent falling edge of the MCM scan clock on die 102 (and not on the subsequent rising edge 252). By capturing on an opposite (e.g., falling) edge from the edge used to launch data (e.g., rising edge), proper setup and hold timing is ensured. This clocking scheme inherently provides hold margin of one-half a clock cycle period. Further, the launched bit is captured within one clock cycle thereby enabling at speed testing.

For the other MCM interconnect lines 109a and 109b, data is normally transmitted from die 102 to die 104. For testing lines 109a and 109b, die 102 is maintained in the shift mode via its own MCM scan-en signal and die 104 is maintained in the capture mode. The timing diagram for launching and capturing test bits on these lines is illustrated in FIG. 4. Data is launched by scan cells on die 102 on rising edge 270 of the MCM scan clock on die 102 and captured by the corresponding scan cells on die 104 on the subsequent rising edge 274 of the MCM scan clock on die 104. Data is thus launched and captured on rising clock edges (or launched and captured on falling edges). As is illustrated in FIG. 4, the data is captured in less than one clock cycle after its launch thereby enabling at speed testing.

As such, data that is captured on the die (die 104) that generates the MCM scan clock, with data launched by the die (die 102) that has a delayed version of the MCM scan clock, captures data on the same edge type (e.g., rising) as the edge used to launch the data. Data that is captured on the die (die 104) that has a delayed version of the MCM scan clock generated by the other die (die 102) captures data on the same edge type used to launch data.

With the embodiments described above, at speed testing of the MCM interface can be performed reusing boundary scan infrastructure with minimal hardware overhead. Further, because the embodiments described herein are based on scan testing, commercial Automatic Test Patter Generation (ATPG) tools can be used for testing against all known fault models, testing the MCM interconnects reliably. The clock scheme discussed above enables both stuck and at-speed testing scenarios and thus reduces effort and scope of errors in manual test creation. Further, the hold timing closure is automatically addressed by the architecture itself. The disclosed embodiments can be extended to test full functional path instead of between boundary scan flops on two dies. If functional flops are used, similar clocking and scan enable schemes may be deployed such that the tests can be generated directly using commercial ATPG tools.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A multi-die chip module (MCM) comprising:
a first die having a first test controller configured to regulate a first scan mode selected from one of a shift mode or a capture mode;
an interconnect connected to the first die; and
a second die connected to the first die via the interconnect, the second die having a second test controller configured to regulate a second scan mode selected from one of the shift mode or the capture mode, the second scan mode alternating with the first scan mode such that:
the second scan mode remains in the shift mode when the first scan mode is in the capture mode; and
the second scan mode remains in the capture mode when the first scan mode is in the shift mode.

2. The MCM of claim 1, wherein:
the first die includes a scan clock circuit configured to generate a scan clock signal; and
the second die is configured to receive the scan clock signal for implementing the second scan mode alternating with the first scan mode.

3. The MCM of claim 2, wherein the second die includes:
an inverter configured to generate an inverted scan clock signal based on the received scan clock signal;
a first scan cell configured to operate under the received scan clock signal having a delay from the scan clock signal of the first die; and
a second scan cell coupled in series with the first scan cell, the second scan cell configured to operate under the inverted scan clock signal.

4. The MCM of claim 2, wherein:
the first die is configured to launch a bit while in the shift mode and during a first rising edge of the scan clock signal; and
the second die is configured to receive the launched bit via the interconnect while in the capture mode and during a first falling edge of the received scan clock signal having a delay from the scan clock signal.

5. The MCM of claim 1, wherein the first test controller is configured to:
receive a first scan enable signal having a first active period and a first inactive period outside of the first active period;
implement the shift mode as the first scan mode during the first active period; and
implement the capture mode as the first scan mode during the first inactive period.

6. The MCM of claim 5, wherein the second test controller is configured to:
receive a second scan enable signal having a second active period and a second inactive period, the first active period overlapping with the first inactive period of the first scan enable signal, and the second inactive period overlapping with the first active period of the first scan enable signal;
implement the shift mode as the second scan mode during the second active period; and
implement the capture mode as the second scan mode during the second inactive period.

7. The MCM of claim 1, wherein the first die includes a scan cell having:
an input multiplexer having:
a first input configured to receive a launched bit;
a second input configured to receive a shifted bit; and
an output configured to deliver the launched bit when the capture mode is selected as the first scan mode, and configured to deliver the shifted bit when the shift mode is selected as the first scan mode; and
a register coupled to the output of the input multiplexer, the register is updated by a first scan clock signal having a delayed synchronization with a second scan clock signal provided to the second die.

8. The MCM of claim 7, wherein the first input of the input multiplexer is configured to receive the launched bit from the second die when the shift mode is selected as the second scan mode.

9. The MCM of claim 7, wherein the second input of the input multiplexer is configured to receive the shifted bit from a second scan cell in the first die when the shift mode is selected as the first scan mode.

10. The MCM of claim 1, wherein the first die includes:
a first scan cell coupled to receive a scan clock signal from the second die, the first can cell configured to receive a first launched bit from the second die when the capture mode is selected as the first scan mode and according to the received scan clock signal; and
a second scan cell serially coupled with the first scan cell to receive a shifted bit from the first scan cell and configured to send a second launched bit to the second die when the shift mode is selected as the first scan mode.

11. The MCM of claim 10, wherein:
the first die includes an inverter configured to generate an inverted scan clock signal based on the scan clock signal; and
the second scan cell is configured to receive the shifted bit and configured to send the second launched bit according to the inverted scan clock signal.

12. An integrated circuit (IC) die for use in a multi-die chip module (MCM) adapted to interface the integrated circuit die and a second integrated circuit (IC) die, the integrated circuit die comprising:
a test controller configured to regulate a first scan mode selected from a capture mode or a shift mode in opposite of a selection of a second scan mode of the second IC die from the capture mode or the shift mode;

a first scan cell coupled with the test controller, when the capture mode is selected as the first scan mode, the first scan cell configured to receive a launched bit from the second IC die with the shift mode selected as the second scan mode;

a second scan cell serially coupled with the first scan cell to receive a shifted bit from the first scan cell when the shift mode is selected as the first scan mode and when the capture mode is selected as the second scan mode; and an inverter configured to generate an inverted scan clock signal based on a scan clock signal received from the second IC die, wherein the first scan cell is configured to receive the launched bit according to the received scan clock signal, and the second scan cell is configured to receive the shifted bit according to the inverted scan clock signal.

13. The IC die of claim 12, where the second scan cell is configured to launch the received shifted bit to the second IC die when the shift mode is selected as the first scan mode and when the capture mode is selected as the second scan mode.

14. The IC die of claim 12, wherein:

the first scan cell is configured to receive the launched bit during a first falling edge of a received scan clock signal having a delay from a first rising edge of the scan clock signal generated by the second IC die; and the second scan cell is configured to send the received shifted bit to the second IC die during a first rising edge of the received scan clock signal following the first falling edge of the received scan clock signal and preceding a second rising edge of the scan clock signal generated by the second IC die.

15. A method of testing at speed an interconnect for a multi-die chip module (MCM), said MCM comprising first and second dies electrically coupled via the interconnect, the method comprising:

configuring the first die to be in a first scan mode selected from one of a shift mode or a capture mode;

configuring the second die to be in a second scan mode selected from one of the shift mode or the capture mode such that the second scan mode is different from the first scan mode; and alternating the first scan mode with the second scan mode, such that:

the second scan mode remains in the shift mode when the first scan mode is in the capture mode; and the second scan mode remains in the capture mode when the first scan mode is in the shift mode; and providing a first scan enable signal to the first die, the first scan enable signal having a first active period and a first inactive period outside of the first active period; and providing a second scan enable signal to the second die, the second scan enable signal having a second active period and a second inactive period, the first active period overlapping with the first inactive period of the first scan enable signal, and the second inactive period overlapping with the first active period of the first scan enable signal.

16. The method of claim 15, wherein configuring the first die includes:

selecting the shift mode as the first scan mode during the first active period; and selecting the capture mode as the first scan mode during the first inactive period.

17. The method of claim 15, wherein configuring the first die includes:

selecting the shift mode as the second scan mode during the second active period; and selecting the capture mode as the second scan mode during the second inactive period.

18. The method of claim 15, further comprising: further comprising:

generating, by the first die, a scan clock signal when the shift mode is selected as the second scan mode;

receiving, by the second die, a delayed scan clock signal having a delay from the scan clock signal when the capture mode is selected as the first scan mode.

* * * * *